United States Patent
Imashiro et al.

(10) Patent No.: US 6,440,258 B1
(45) Date of Patent: Aug. 27, 2002

(54) ADHESIVE FILM FOR SEMICONDUCTOR PACKAGE

(75) Inventors: Yasuo Imashiro; Takahiko Ito; Hideshi Tomita; Norimasa Nakamura, all of Tokyo (JP)

(73) Assignee: Nisshinbo Industries, Inc., Tokyo (JP)

( * ) Notice: Subject to any disclaimer, the term of this patent is extended or adjusted under 35 U.S.C. 154(b) by 0 days.

(21) Appl. No.: 09/400,970

(22) Filed: Sep. 22, 1999

(30) Foreign Application Priority Data

Sep. 30, 1998 (JP) .......................................... 10-277704

(51) Int. Cl.$^7$ .............................................. C09J 163/10
(52) U.S. Cl. ............................. 156/331.1; 428/355 EN; 428/355 N; 428/347; 428/352; 428/355 EP; 438/118; 156/330; 156/331.5
(58) Field of Search ................................ 428/343, 347, 428/352, 355 R, 355 EP, 355 CN, 355 N; 438/118; 156/330, 331.1, 331.5

(56) References Cited

U.S. PATENT DOCUMENTS 6,143,409 A * 11/2000 Komoto et al. ......... 428/355 R

* cited by examiner

*Primary Examiner*—Robert Dawson
*Assistant Examiner*—Christopher M. Keehan
(74) *Attorney, Agent, or Firm*—Kubovcik & Kubovcik

(57) ABSTRACT

The present invention provides an adhesive film for semiconductor package, which comprises a polycarbodiimide resin, an epoxy resin and an inorganic filler, wherein the polycarbodiimide resin has a polystyrene-reduced number-average molecular weight of 3,000 to 50,000 as measured by gel permeation chromatography, the epoxy resin is contained in an amount of 20 to 150 parts by weight per 100 parts by weight of the polycarbodiimide resin, and the inorganic filler is contained in an amount of 30 to 70% by weight based on the total resin content.

4 Claims, No Drawings

ADHESIVE FILM FOR SEMICONDUCTOR PACKAGE

BACKGROUND OF THE INVENTION (1) Field of the Invention

The present invention relates to an adhesive film for semiconductor package. More particularly, the present invention relates to an adhesive film for semiconductor package which is superior in heat resistance and reliability.

(2) Description of the Prior Art

Various adhesives have generally been used for adhesion of the members of a semiconductor device, such as lead pin, substrate for mounting of semiconductor chip, radiator, semiconductor chip and the like. These adhesives include, for example, an adhesive comprising an epoxy group-terminated modified polyamide resin (JP-A-5-51447); an adhesive comprising an epoxy resin and a polyimide resin having polysiloxane units (JP-A-6-200216); and an adhesive comprising an imide type resin (JP-A-10-135248).

However, these adhesives have respective problems. The adhesive comprising an epoxy group-terminated modified polyamide resin has insufficient heat resistance because the modified polyamide resin used therein has a low glass transition temperature, and shows no sufficient adhesivity particularly to the glossy surface of copper foil. The adhesive comprising an epoxy resin and a polyimide resin having polysiloxane units is insufficient in the adhesivity of polyimide resin and the resistance to; soldering heat. The adhesive comprising an imide type resin has a problem in that it tends to cause cracking in the heat shock test conducted for the semiconductor package obtained.

SUMMARY OF THE INVENTION

The present invention aims at alleviating the problems of the prior art, i.e. inferior heat resistance, adhesivity, resistance to soldering heat and resistance to repeated heating and providing an adhesive film for semiconductor package, superior in reliability.

According to the present invention, there is provided an adhesive film for semiconductor package, which comprises a polycarbodiimide resin, an epoxy resin and an inorganic filler, wherein the polycarbodiimide resin has a polystyrene-reduced number-average molecular weight of 3,000 to 50,000 as measured by gel permeation chromatography, the epoxy resin is contained in an amount of 20 to 150 parts by weight per 100 parts by weight of the polycarbodiimide resin, and the inorganic filler is contained in an amount of 30 to 70% by weight based on the total resin content.

DETAILED DESCRIPTION OF THE INVENTION

The present invention is described in detail below.

The adhesive film for semiconductor package according to the present invention is composed essentially of a polycarbodiimide resin, an epoxy resin and an inorganic filler. As this polycarbodiimide resin, there can be used those produced by various methods. There can be used isocyanate-terminated polycarbodiimides produced fundamentally by the conventional method for producing a polycarbodiimide [U.S.P. 2,941,956; JP-B-47-33,279; J. Org. Chem., 28, 2069–2075 (1963); Chemical Review 1981, Vol. 81, No. 4, pages 619–621], specifically by the carbon dioxide removal and condensation reaction of an organic polyisocyanate.

In the above-mentioned method, as the organic polyisocyanate which is the starting material for synthesizing the polycarbodiimide compound, there can be used, for example, aromatic polyisocyanates, aliphatic polyisocyanates, alicyclic polyisocyanates and mixtures thereof, and specifically, there can be mentioned 1,5-naphthalene diisocyanate, 4,4'-diphenylmethane diisocyanate, 4,4'-diphenyldimethylmethane diisocyanate, 1,3-phenylene diisocyanate, 1,4-phenylene diisocyanate, 2,4-tolylene diisocyanate, 2,6-tolylene diisocyanate, a mixture of 2,4-tolylene diisocyanate and 2,6-tolylene diisocyanate, hexamethylene diisocyanate, cyclohexane-1,4-diisocyanate, xylylene diisocyanate, isophorone diisocyanate, dicyclohexylmethane-4,4'-diisocyanate, methylcyclohexane diisocyanate, tetramethyl-xylylene diisocyanate, 2,6-diisopropylphenyl diisocyanate, and 1,3,5-triisopropylbenzene-2,4-diisocyanate.

Among them, those obtained from at least one aromatic polyisocyanate are preferable as the polycarbodiimide resin to be used in the present invention. Incidentally, the aromatic polyisocyanate refers to an isocyanate having, in the molecule, at least two isocyanate groups bonded directly to the aromatic ring.

As the above-mentioned polycarbodiimide, there can also be used those polycarbodiimides whose terminals are blocked with a compound (e.g. a monoisocyanate) reactive with the terminal isocyanates of polycarbodiimide and whose polymerization degrees are controlled at an appropriate level.

As the monoisocyanate for blocking the terminals of polycarbodiimide to control the polymerization degree thereof, there can be mentioned, for example, phenyl isocyanate, tolylene isocyanate, dimethylphenyl isocyanate, cyclohexyl isocyanate, butyl isocyanate, and naphthyl isocyanate.

As the other compounds reactive with the terminal isocyanates of polycarbodiimide, there can be used, for example, aliphatic compounds, aromatic compounds or alicyclic compounds having -OH group (such as methanol, ethanol, phenol, cyclohexanol, N-methylethanolamine, polyethylene glycol monomethyl ether, polypropylene glycol monomethyl ether and the like), =NH group (such ad diethylamine, dicyclohexylamine and the like), —NH$_2$ group (such as butylamine, cyclohexylamine and the like), —COOH group (such as propionic acid, benzoic acid, cyclohexanecarboxylic acid and the like), —SH group (such as ethylmercaptan, allylmercaptan, thiophenol and the like), epoxy group, or the like.

The carbon dioxide removal and condensation reaction of the above organic polyisocyanate proceeds in the presence of a carbodiimidation catalyst. As the carbodiimidation catalyst, there can be used, for example, phosphorene oxides such as 1-phenyl-2-phosphorene-1-oxide, 3-methyl-1-phenyl-2-phosphorene-1-oxide, 1-ethyl-2-phosphorene-1-oxide, 3-methyl-2-phosphorene-1-oxide, 3-phosphorene isomers thereof, and the like. Among them, 3-methyl-1-phenyl-2-phosphorene-1-oxide is suitable from the standpoint of reactivity.

The polycarbodiimide resin used in the present invention has a polystyrene-reduced number-average molecular weight of 3,000 to 50,000, preferably 10,000 to 30,000, and more preferably 15,000 to 25,000, as measured by gel permeation chromatography (GPC) regardless of whether or not the above-mentioned terminal-blocking agent is used. When the number-average molecular weight is smaller than 3,000, no sufficient film-formability or heat resistance can be obtained. When the number-average molecular weight exceeds 50,000, a long period of time is required for the synthesis of polycarbodiimide resin and, in addition, the polycarbodiimide resin varnish obtained has an extremely short pot life (service life). Therefore, such number-average molecular weights are not practical.

As the epoxy resin used in the present invention, there can be mentioned epoxy resins having at least two epoxy groups in the molecule, for example, glycidyl ether type epoxy resins, representatives of which are bisphenol A type epoxy resins, bisphenol F type epoxy resins, phenolic novolac type epoxy resins and cresol novolac type epoxy resins; alicyclic epoxy resins; glycidyl ester type epoxy resins; heterocyclic epoxy resins; and liquid rubber-modified epoxy resins. They are used alone or in admixture of two or more. Preferable are bisphenol A type epoxy resins, bisphenol F type epoxy resins, phenolic novolac type epoxy resins and cresol novolac type epoxy resins. However, the epoxy resins used in the present invention are not limited to them and all generally known epoxy resins may be used.

In the present invention, the proportions of the polycarbodiimide resin and the epoxy resin used are 100 parts by weight for the former and 20 to 150 parts by weight, preferably 40 to 130 parts by weight, more preferably 50 to 100 parts by weight for the latter. When the proportion of the epoxy resin is smaller than 20 parts by weight, the mixture of the two resin shows no improvement in heat resistance. When the proportion of the epoxy resin is larger than 200 parts by weight, the mixture has inferior film-formability.

The adhesive film for semiconductor package comprises an inorganic filler in addition to the above two resins. As the inorganic filler, there can be mentioned, for example, silica, a quartz powder, alumina, calcium carbonate, magnesium oxide, a diamond powder, mica, a fluororesin and a zircon powder.

In the present invention, the inorganic filler is contained in an amount of 30 to 70% by weight based on the total resin content, i.e. the total amount of the polycarbodiimide resin and the epoxy resin. When the amount of the -inorganic filler is smaller than 30% by weight, the resulting adhesive film has a large coefficient of linear expansion, resulting in reduced reliability of the semiconductor package obtained. When the amount is larger than 70% by weight, the resulting adhesive film has low adhesivity. Therefore, neither of these amounts can achieve the object of the present invention.

In producing the present adhesive film for semiconductor package, comprising the polycarbodiimide resin, the epoxy resin and the inorganic filler, these components are first mixed. This mixing can be conducted, for example, by mixing the components at room temperature, or by mixing them with heating,. or by dissolving the epoxy resin in an appropriate solvent and then mixing the solution with other components. There is no particular restriction as to the method for mixing.

The above-obtained mixture of the polycarbodiimide resin, the epoxy resin and the inorganic filler is then made into a film by an ordinary method, for example, by casting the mixture on a polyethylene terephthalate (PET) film subjected to a treatment for easy release, using a coater and then heating the resulting material to remove the solvent contained therein. There is no particular restriction as to the method for film making.

The term "film" used in the present specification means a film having a thickness of approximately 10 to 500 μm.

In using the thus-obtained adhesive film for semiconductor package, of the present invention for adhesion of the members of a semiconductor device, such as lead pin, substrate for mounting of semiconductor chip, radiator, semiconductor chip and the like, the adhesive film for semiconductor package is cut into a predetermined size; the cut film is interposed, for example, between semiconductor elements and a lead frame or between a ceramic substrate and a lead frame; and the resulting material is subjected to a treatment of 150 to 300° C., 0.1 to 5 kg/cm$^2$ and 5 seconds to 10 minutes.

The adhesive film for semiconductor package according to the present invention is flexible at room temperature, becomes more flexible and moreover adhesive when heated lightly, and is cured and exhibits adhesivity when heated strongly. The use of an. inorganic filler can keep low the thermal expansion coefficient of the film.

DESCRIPTION OF THE PREFERRED EMBODIMENTS

The present invention is described in more detail below by way of Examples.

EXAMPLE 1

Into a reactor equipped with a stirrer and a condenser were fed 172 g of 4,4'-diphenylmethane diisocyanate (referred to hereinafter as MDI), 1.64 g of phenyl isocyanate (referred to hereinafter as PI), 1,290 g of tetrahydrofuran (referred to hereinafter as THF) as a solvent and 0.34 g of 3-methyl-1-phenyl-2-phosphorene-1-oxide as a catalyst, and they were-subjected to a reaction at 70° C. for 15 hours, to obtain a varnish of a polycarbodiimide having a number-average molecular weight (referred to hereinafter as Mn) of $2.0 \times 10^4$ (polystyrene-reduced value) as determined by GPC. To this varnish were added an epoxy resin [Epikote 828 (trade name), a product of Yuka Shell Epoxy K. K.] in an amount of 70 parts by weight per 100 parts by weight of the resin content of the varnish and alumina as an inorganic filler in an amount of 50% by weight based on the total resin content, and they. were mixed with stirring. The varnish thus obtained was cast on a PET film which had been subjected to a treatment for easy release, dried and then peeled to obtain an adhesive film for semiconductor package, having a thickness of 100 μm.

EXAMPLE 2

The same procedure as in Example 1 was repeated except that the amount of PI was changed to 6.56 g (incidentally, the Mn of the polycarbodiimide obtained was $6.2 \times 10^3$), whereby was obtained an adhesive film for semiconductor package, having a thickness of 100 μm.

EXAMPLE 3

Into a reactor equipped with a stirrer and a condenser were fed 174 g of a 80:20 (by weight) mixture of 2,4'-tolylene diisocyanate and 2,6'-tolylene diisocyanate, 1.79 g of PI, 1,200 g of toluene as a solvent and 0.3–4 g of 3-methyl-1-phenyl-2-phosphorene-1-oxide as a catalyst, and the resulting mixture was subjected to a reaction at 100° C. for 14 hours to obtain a varnish of a polycarbodiimide having a number average molecular weight (Mn) of $1.6 \times 10^4$ (polystyrene-reduced value) as determined by GPC. To this varnish were added an epoxy resin [Epikote 828 (trade name), a product of Yuka Shell Epoxy K. K.] in an amount of 50 parts by weight per 100 parts by weight of the resin content of the varnish and fused silica as an inorganic filler in a proportion of 60% by weight based on the total resin content, and they were mixed with stirring to obtain a varnish. This varnish was cast on a PET film which had been subjected to a treatment for easy release, dried and then peeled to obtain an adhesive film for semiconductor package, having a thickness of 100 μm.

EXAMPLE 4

The same procedure as in Example 1 was repeated except that the kind and amount of the inorganic filler were changed to calcium carbonate and 40% by weight based on the total resin content, whereby was obtained an adhesive film for semiconductor package, having a thickness of 100 μm.

EXAMPLE 5

Into a reactor equipped with a stirrer and a condenser were fed 172 g of MDI, 3.28 g of PI, 1,290 g of THF as a solvent and 0.34 g of 3-methyl-1-phenyl-2-phosphorene-1-oxide as a catalyst, and they were subjected to a reaction at 70° C. for 13 hours, to obtain a varnish of a polycarbodiimide having a number-average molecular weight (referred to hereinafter as Mn) of $1.0 \times 10^4$ (polystyrene-reduced value) as determined by GPC. To * this varnish were added two kinds of epoxy resins [Epikote 828 (trade name), a product of Yuka Shell Epoxy K. K. and YDCN-703 (trade name), a product of Toto Kasei] in amounts of 50 parts by weight and 20 parts by weight, respectively, per 100 parts by weight of the resin content of the varnish, and alumina as an inorganic filler in an amount of 70% by weight based on the total resin content, and they were mixed with stirring. The varnish thus obtained was cast on a PET film which had been subjected to a treatment for easy release, dried and then peeled to obtain an adhesive film for semiconductor package, having a thickness of 100 μm.

COMPARATIVE EXAMPLE 1

To 100 parts by weight of an epoxy resin [Epikote 828 (trade name), a product of Yuka Shell Epoxy K. K.] were added 10 parts by weight of dicyandiamide, 30 parts by weight of methyl ethyl ketone and 20 parts by weight of dimethylformamide. Further was added alumina in an amount of 40% by weight based on the total resin content. The mixture was stirred, casted on a PET film which had been subjected to a treatment for easy release, dried and peeled to obtain an adhesive film for semiconductor package, having a thickness of 100 μm.

COMPARATIVE EXAMPLE 2

The same procedure as in Example 3 was repeated except that the amount of the epoxy resin added was changed to 200 parts by weight on the same basis, whereby was obtained an adhesive film for semiconductor package, having a thickness of 100 μm.

The adhesive films obtained in the Examples and the Comparative Examples were measured for the following properties according to the following test methods.

(1) Film Appearance and Strength

Each adhesive film was visually observed for the appearance. Also, the film was visually observed for the condition when bent by 180° C.

(2) Coefficient of Linear Expansion

According to JIS K 7197, each adhesive film was subjected to a heat treatment of 200° C.×20 minutes; the resulting sample was measured for its linear expansion coefficient at a temperature elevation rate of 5° C./min, using TMA/SS6100 (a product of Seiko Instruments). ps (3) Heat Cycle Test Each adhesive film was cut into a predetermined size, then placed on a ceramic plate mounted on a hot press, and adhered temporarily to the ceramic plate under the conditions of 170° C.×1 minute×5 kg/cm². The ceramic plate and a lead frame (made of 42 alloy) were laminated with each other via the adhesive film temporarily adhered to the ceramic plate, under the conditions of 180° C.×1 minute×10 kg/cm². The resulting material (a sample) was subjected to 500 times of a heat cycle. test at −25 to 125° C., and then examined for the condition of peeling-using an ultrasonic flaw detector (M-700II, a product of Canon) to determine the number of samples showing peeling/total sample number (10).

(4) Peeling Strength

Each adhesive film was laminated on the glossy surface of a 35 m-thick electrolytic copper foil (a product of Nikko Gould Foil) under the press conditions of 180° C.×30 kg/cm²×30 minutes, to. prepare a test sample. The test sample was measured for the peeling strength according to JIS C 6481.

The results of measurements are shown in Table 1.

TABLE 1

|  | Film appearance[a] | Linear expansion coefficient (° C.$^{-1}$) | Heat cycle test | Peeling strength (kg/cm) |
| --- | --- | --- | --- | --- |
| Example 1 | o | $1.5 \times 10^{-5}$ | 0/10 | 1.9 |
| Example 2 | o | $1.6 \times 10^{-5}$ | 0/10 | 1.8 |
| Example 3 | o | $1.0 \times 10^{-5}$ | 0/10 | 1.8 |
| Example 4 | o | $2.1 \times 10^{-5}$ | 0/10 | 1.6 |
| Example 5 | o | $0.9 \times 10^{-5}$ | 0/10 | 1.7 |
| Comp. Ex. 1 | x | $3.0 \times 10^{-5}$ | 8/10 | 1.5 |
| Comp. Ex. 2 | x | $2.1 \times 10^{-5}$ | 3/10 | 0.9 |

[a]o: There is no unevenness on the film surface. There is no crack when bent by 180°.

a) o: There is no unevenness on the film surface.
   There is no crack when bent by 180°.
   x: There are unevennesses on the film surface.
   There are cracks when bent by 180°.

As is clear from the Examples and the Comparative Examples, the adhesive film for semiconductor package according to the present invention is tack-free and easy to handle; has a low coefficient of linear expansion; has sufficient resistance to soldering heat, sufficient resistance to repeated heating and sufficient adhesivity, owing to the combined use of a polycarbodiimide resin and an epoxy resin both having excellent heat resistance; can be suitably used for adhesion of the members of a semiconductor device, such as lead pin, substrate for mounting of semiconductor chip, radiator, semiconductor chip and the like; and is highly reliable.

What is claimed is:

1. An adhesive film for semiconductor package, which comprises a polycarbodiimide resin, an epoxy resin and an inorganic filler, wherein the polycarbodiimide resin has a polystyrene-reduced number-average molecular weight of 3,000 to 50,000 as measured by gel permeation chromatography, the epoxy resin is contained in an amount of 40 to 130 parts by weight per 100 parts by weight of the polycarbodiimide resin, and the inorganic filler is contained in an amount of 30 to 70% by weight based on the total resin content.

2. An adhesive film for semiconductor package according to claim 1, wherein the polycarbodiimide resin is one obtained from at least one kind of aromatic polyisocyanate.

3. A method for adhering components of a semiconductor package comprising:
   a) providing an adhesive film for semiconductor package which comprises a polycarbodiimide resin, an epoxy resin and an inorganic filler, wherein the polycarbodiimide resin has a polystyrene-reduced number-average molecular weight of 3,000 to 50,000 as measured by gel permeation chromatography, the epoxy resin is contained in an amount of 40 to 130 parts by weight per 100 parts by weight of the polycarbodiimide resin, and the inorganic filler is contained in an amount of 30 to 70% by weight based on the total resin content;

b) interposing said adhesive film for semiconductor package between components of a semiconductor package to obtain a precursor semiconductor package; and c) heat treating the precursor semiconductor package at a temperature of 150 to 300° C. and a pressure of 0.1 to 5 Kg/cm$^2$ for a period of 5 seconds to 10 minutes.

4. The method for adhering components of a semiconductor package according to claim 3, wherein the polycarbodiimide resin is one obtained from at least one kind of aromatic polyisocyanate.

* * * * *